US009825061B2

(12) United States Patent
Xu et al.

(10) Patent No.: US 9,825,061 B2
(45) Date of Patent: Nov. 21, 2017

(54) ARRAY SUBSTRATE WHEREIN A SOURCE ELECTRODE, DRAIN ELECTRODE, AND PIXEL ELECTRODE ARE ARRANGED IN A SAME LAYER AND LIQUID CRYSTAL DISPLAY PANEL HAVING THE SAME

(71) Applicant: Boe Technology Group Co., Ltd., Beijing (CN)

(72) Inventors: Chuanxiang Xu, Beijing (CN); Shi Shu, Beijing (CN); Yonglian Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 122 days.

(21) Appl. No.: 14/589,002

(22) Filed: Jan. 5, 2015

(65) Prior Publication Data

US 2016/0172376 A1    Jun. 16, 2016

(30) Foreign Application Priority Data

Dec. 15, 2014    (CN) .......................... 2014 1 0769917

(51) Int. Cl.
*H01L 27/12*    (2006.01)
*G02F 1/1368*    (2006.01)
*G02F 1/1362*    (2006.01)

(52) U.S. Cl.
CPC .......... *H01L 27/124* (2013.01); *G02F 1/1368* (2013.01); *G02F 1/136286* (2013.01);
(Continued)

(58) Field of Classification Search
CPC .......... G02F 2001/13685; G02F 2001/136295; H01L 27/1259
(Continued)

(56) References Cited

U.S. PATENT DOCUMENTS 6,154,264 A    11/2000  Koide et al.
2001/0032981 A1*  10/2001  Kong ................. G02F 1/13439
                                                          257/72
(Continued)

FOREIGN PATENT DOCUMENTS

CN    204257648    4/2015
JP    10-161143    6/1998
KR   1020090044467    5/2009

OTHER PUBLICATIONS

Office action from Chinese Application No. 201410769917.8 dated Nov. 10, 2016.

*Primary Examiner* — Paul Lee
(74) *Attorney, Agent, or Firm* — Calfee, Halter & Griswold LLP

(57) ABSTRACT

This disclosure provides an array substrate, comprising a substrate plate, and a thin film transistor and a pixel electrode formed on the substrate plate, said thin film transistor comprising a source/drain electrode, an active region and a gate electrode stacked sequentially on said substrate plate, wherein said source/drain electrode and said pixel electrode are arranged in the same layer on the substrate plate. According to this disclosure, while the properties of a high reflectivity and a high aperture ratio are guaranteed, the times of the patterning process are decreased and the process steps are saved, resulting in an improved production tempo and an effectively controlled cost. This disclosure also provides a method for fabricating an array substrate, a liquid crystal display panel comprising said array substrate and a reflective liquid crystal display.

5 Claims, 3 Drawing Sheets

(52) U.S. Cl.
CPC .................. *H01L 27/1259* (2013.01); *G02F 2001/13685* (2013.01); *G02F 2001/136295* (2013.01)

(58) Field of Classification Search
USPC .......................................................... 349/47
See application file for complete search history.

(56) References Cited

U.S. PATENT DOCUMENTS

| | | | |
|---|---|---|---|
| 2008/0035999 A1* | 2/2008 | Kim .................... | G02F 1/13458 257/347 |
| 2009/0065783 A1* | 3/2009 | Moriwaki ......... | G02F 1/136209 257/72 |
| 2009/0309103 A1* | 12/2009 | Yagi .................. | G02F 1/133345 257/72 |
| 2012/0127389 A1* | 5/2012 | Nagami ............ | G02F 1/134309 349/47 |

* cited by examiner

ARRAY SUBSTRATE WHEREIN A SOURCE ELECTRODE, DRAIN ELECTRODE, AND PIXEL ELECTRODE ARE ARRANGED IN A SAME LAYER AND LIQUID CRYSTAL DISPLAY PANEL HAVING THE SAME

RELATED APPLICATION(S)

The present application claims the benefit of Chinese Patent Application No. 201410769917.8, filed Dec. 15, 2014, the entire disclosure of which is incorporated herein by reference.

FIELD OF THE INVENTION

This disclosure relates to the technical field of display, and particularly to an array substrate, a method for fabricating the same, a liquid crystal display panel comprising said array substrate and a reflective liquid crystal display.

BACKGROUND ART

As shown in FIG. 1, a transmissive liquid crystal display usually comprises a transmissive liquid crystal display panel 10, which comprises a backlight source 101 and a transmissive liquid crystal cell 102. As shown by arrows in the drawing, light emitted from the backlight source 101 passes through the transmissive liquid crystal cell 102 to implement the display function. Since the backlight source 101 usually adopts an organic light emitting diode, it has a low brightness, and as a result the traditional transmissive liquid crystal display is poorly readable for outdoor display. In case the outdoor readability is improved by increasing brightness, the transmissive liquid crystal display will be subject to problems of increased power consumption, decreased duration and heat dissipation.

As shown in FIG. 2, a reflective liquid crystal display usually comprises a reflective liquid crystal display panel 20 with a reflective liquid crystal cell 201. As shown by arrows in the drawing, the reflective liquid crystal cell 201 reflects light from the ambient so as to implement the display function. In a reflective liquid crystal display, the higher brightness the ambient light has, the brighter the reflected light becomes, and thereby the readability for outdoor display is increased. Since there is no need of backlight sources in the reflective liquid crystal display, the power consumption can be reduced significantly, the duration can be prolonged, and the product can be easily made lighter and thinner.

In the existing reflective liquid crystal display, an array substrate is usually made with the following steps: forming a film for a gate electrode layer and forming a gate electrode pattern by a first patterning process, forming a film for a gate insulating layer and forming a semiconductor layer pattern by a second patterning process, forming a film for a source/drain electrode layer and forming a source/drain electrode pattern by a third patterning process, forming a film for a passivation layer and forming a passivation layer by a fourth patterning process, forming a film for a resin layer and forming a flat resin layer by a fifth patterning process, forming a film for a pixel electrode layer and forming a pixel electrode pattern by a sixth patterning process, and forming a film for a metal protecting layer and forming a metal protecting layer by a seventh patterning process. Each patterning process in the above fabricating method comprises procedures like coating a photoresist, exposing the photoresist with a mask, developing the photoresist, etching the object to be patterned, and peeling the photoresist. In the above fabricating method, a patterning process is usually performed seven times for the array substrate of the existing reflective liquid crystal display.

Therefore, there is still room for improvement of the existing reflective liquid crystal display, and there is such a demand in the art.

SUMMARY

An object of this disclosure is to mitigate or solve the problems mentioned above. According to this disclosure, a top-gate-type design is adopted in the array substrate of a reflective liquid crystal display, and the source/drain electrode and the pixel electrode are formed simultaneously. Thereby, not only a high reflectivity and a high aperture ratio are guaranteed, but also the times of the patterning process are decreased.

According to a first aspect of this disclosure, an array substrate is provided, comprising a substrate plate, and a thin film transistor and a pixel electrode formed on the substrate plate, said thin film transistor comprising a source/drain electrode, an active region and a gate electrode stacked sequentially on said substrate plate, wherein said source/drain electrode and said pixel electrode are arranged in the same layer on the substrate plate.

According to this disclosure, the thin film transistor on the array substrate adopts a top-gate-type design, in which the ambient light can be blocked by the gate electrode and hence the active region will not be irradiated lest it should generate a photocurrent due to irradiation by the ambient light. Therefore, according to this disclosure, the linewidth of the black matrix that is required on a color filter substrate can be reduced, which may improve the aperture ratio of the reflective liquid crystal display.

According to this disclosure, said source/drain electrode and said pixel electrode are arranged in the same layer on the substrate plate. As the pixel electrode is formed on a flat substrate plate, it has a high reflectivity, which is favorable for improving the readability of the reflective liquid crystal display for outdoor display.

As compared with a transmissive liquid crystal display, the reflective liquid crystal display according to this disclosure has inherent advantages, i.e., no backlight sources are required, resulting in significantly reduced power consumption and prolonged duration, and the product can be easily made lighter and thinner. Additionally, as compared with an existing reflective liquid crystal display, the reflective liquid crystal display according to this disclosure decreases the times of the patterning process and saves process steps, and accordingly improves the production tempo and controls the cost effectively, while guaranteeing the properties of a high reflectivity and a high aperture ratio.

In one embodiment, said array substrate may further comprise an active region protecting layer arranged between said substrate plate and said thin film transistor. According to this disclosure, the active region protecting layer can be an inorganic insulating layer so as to protect a subsequently formed active region of semiconductor materials and avoid the formation of a bad interface due to direct contact of the active region with a substrate plate of e.g. glass.

In one embodiment, said array substrate may further comprise a data line located in a data line region and disposed in the same layer as said source/drain electrode. According to this disclosure, said data line and said source/drain electrode are formed in the same process, which facilitates simplifying the techniques and reducing the cost.

In one embodiment, said array substrate may further comprise a gate insulating layer which is disposed between said active region and said gate electrode and covers said active region, said source/drain electrode, said pixel electrode and said data line. According to this disclosure, the gate insulating layer covers said source/drain electrode to avoid an electrical short circuit between said source/drain electrode and the subsequently formed gate electrode. Besides, according to this disclosure, the gate insulating layer covers said pixel electrode to avoid oxidization or corrosion of said pixel electrode.

In one embodiment, said array substrate may further comprise a gate line located in a gate line region and disposed in the same layer as said gate electrode. According to this disclosure, said gate line and said gate electrode are formed in the same process, which facilitates simplifying the techniques and reducing the cost.

In one embodiment, said array substrate may further comprise a passivation layer that covers said gate electrode, said gate insulating layer and said gate line. According to this disclosure, said passivation layer protects the gate electrode from being oxidized or corroded. Besides, according to this disclosure, owing to the top-gate-type design, said pixel electrode and said source/drain electrode are formed on said substrate plate simultaneously, so said pixel electrode is covered by said gate insulating layer and said passivation layer such that it does not have to risk being oxidized or corroded.

In one embodiment, a first via hole penetrating said gate insulating layer and said passivation layer can be provided above said data line, and a second via hole penetrating said passivation layer can be provided above said gate line. Moreover, said first via hole and said second via hole can be covered by a metal protecting layer.

In one embodiment, in a direction perpendicular to said substrate plate, the projection of said active region completely falls within the projection of said gate electrode. According to this disclosure, said gate electrode is arranged above said active region and its projection in a perpendicular direction completely covers said active region, such that ambient light can be completely blocked by said gate electrode and said active region will not be irradiated.

According to a second aspect of this disclosure, a method for fabricating an array substrate is provided, comprising: step S600, depositing an electrically conductive material on a substrate plate and forming a pattern comprising a source/drain electrode and a pixel electrode by a patterning process; step S602, depositing a semiconductor material on said substrate plate obtained from step S600 and forming a pattern comprising an active region by a patterning process; and step S604, depositing an insulating material on said substrate plate obtained from step S602 to form a gate insulating layer, and further depositing an electrically conductive material and forming a pattern comprising a gate electrode by a patterning process.

In one embodiment, said method for fabricating an array substrate may further comprise: prior to step S600, depositing a dielectric material on said substrate plate to form an active region protecting layer.

In one embodiment, in step S600, said patterning process may further form a data line located in a data line region.

In one embodiment, in step S604, said patterning process may further form a gate line located in a gate line region.

In one embodiment, said method for fabricating an array substrate may further comprise: depositing a dielectric material on said substrate plate obtained from step S604 and forming a pattern comprising a passivation layer by a patterning process.

In one embodiment, said method for fabricating an array substrate may further comprise: forming a first via hole penetrating said gate insulating layer and said passivation layer above said data line, forming a second via hole penetrating said passivation layer above said gate line, depositing an electrically conductive material and forming a pattern comprising a metal protecting layer by a patterning process.

According to a third aspect of this disclosure, a liquid crystal display panel is provided, comprising said array substrate described above, a color filter substrate, and liquid crystals arranged between said array substrate and said color filter substrate.

According to a fourth aspect of this disclosure, a reflective liquid crystal display is provided, comprising the liquid crystal display panel described above.

Said method for fabricating an array substrate, said liquid crystal display panel and said reflective liquid crystal display according to this disclosure have advantages the same as or similar to those of said array substrate described above, so no more details shall be given herein for simplicity.

BRIEF DESCRIPTION OF DRAWINGS

In the following text, this disclosure will be explained in detail by examples with reference to the embodiments in combination with figures as follows.

DETAILED DESCRIPTION OF EMBODIMENTS

The following descriptions are provided such that any one skilled in the art can achieve and utilize this disclosure, and the descriptions are provided in a specific application and a context required thereby. Those skilled in the art can easily conceive of adjusting the disclosed embodiments in various manners, and the general principles defined here can be applied to other embodiments and also applied without violation of the spirit and scope of this disclosure. Therefore, this disclosure should be given the broadest scope in consistency with the Claims, instead of being limited by the embodiments provided.

The figures of all embodiments in this disclosure all schematically illustrate structures and/or portions relevant to the inventive point, whereas structures and/or portions irrelevant to the inventive point are not illustrated or only partially illustrated.

The reference signs are listed as follows: 10: transmissive liquid crystal display panel; 101: backlight source; 102: transmissive liquid crystal cell; 20: reflective liquid crystal display panel; 201: reflective liquid crystal cell; 401: substrate plate; 402: source/drain electrode; 403: pixel electrode; 404: active region; 405: gate insulating layer; 406: gate electrode; 407: passivation layer; 408: metal protecting layer; 409: data line; 410: gate line; 411: first via hole; 412: second via hole; 440: pixel region; 460: data line region; and 480: gate line region.

Figure 1:
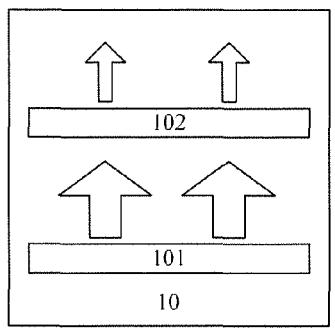
FIG. 1 is a schematic view of a traditional transmissive liquid crystal display.
Figure 2:
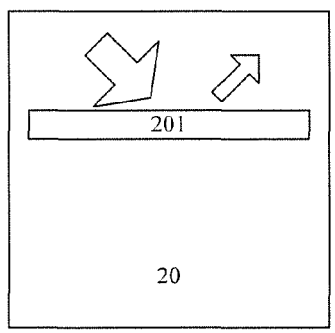
FIG. 2 is a schematic view of a reflective liquid crystal display.
Figure 3:
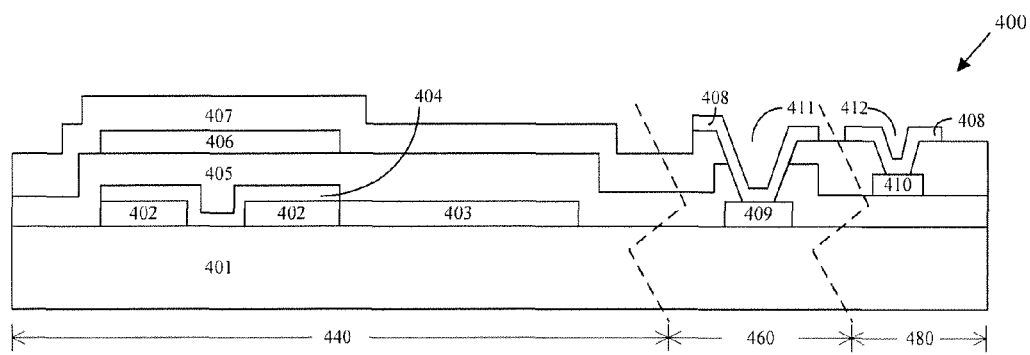
FIG. 3 is a schematic cross-sectional view of the array substrate according to this disclosure.

FIG. 3 is a schematic cross-sectional view of an array substrate 400 according to this disclosure. As shown in FIG. 3, in a pixel region 340, array substrate 400 comprises a substrate plate 401 and a thin film transistor and pixel electrode 403 arranged on the substrate plate 401. The thin film transistor comprises a source/drain electrode 402, an active region 404, a gate insulating layer 405, a gate electrode 406 and a passivation layer 407 stacked sequentially on said substrate plate 401.

The gate electrode 406 is arranged above the source/drain electrode 402, which means that the thin film transistor is of a top-gate-type design. Based on a top-gate design, the ambient light can be blocked by the gate electrode 406 and hence the active region 404 will not be irradiated lest it should generate a photocurrent due to irradiation by the ambient light. Thereby, the linewidth of the black matrix that is required on the color filter substrate can be reduced so as to improve the aperture ratio of the reflective liquid crystal display.

In the existing reflective liquid crystal display, the patterning process are performed three times (i.e., the third, fifth and seventh patterning process) to form a source/drain electrode and pixel electrode. However, according to this disclosure as shown in FIG. 3, the pixel electrode 403 and the source/drain electrode 402 are simultaneously formed on the substrate plate 401, so the patterning process is performed only once to form the source/drain electrode 402 and the pixel electrode 403, and hence the patterning process are reduced by two times with respect to the prior art. With the saved patterning process, the number of masks for use is reduced and the process steps are decreased, which facilitates reducing the cost.

According to this disclosure, the pixel electrode 403 can be directly formed on the substrate plate 401. The substrate plate 401 has a flat surface which facilitates improving the reflectivity of the pixel electrode 403 and in turn enhancing the display effect of the reflective liquid crystal display. For example, the readability of the reflective liquid crystal display for outdoor display can be improved.

In the array substrate 400 shown in FIG. 3, the thin film transistor is directly formed on a substrate plate 401. Alternatively, the array substrate 400 can further comprise an active region protecting layer (not shown) between the substrate plate 401 and the thin film transistor. The active region protecting layer can be an inorganic insulating layer so as to protect the subsequently formed active region of semiconductor materials and avoid forming a poor interface due to direct contact of the active region with a substrate plate of, for example, glass.

Array substrate 400 may further comprise a data line 409 located in a data line region 460 and disposed in the same layer as said source/drain electrode 402. Since said data line 409 and said source/drain electrode 402 are formed in the same process, this facilitates simplifying the techniques and reducing the cost.

Array substrate 400 may further comprise a gate insulating layer 405. The gate insulating layer 405 is disposed between said active region 404 and said gate electrode 406 and covers said active region 404, said source/drain electrode 402, said pixel electrode 403 and said data line 409. The gate insulating layer 405 covers said pixel electrode 403 to avoid oxidization or corrosion of said pixel electrode 403.

Array substrate 400 may further comprise a gate line 410 located in a gate line region 408 and disposed in the same layer as said gate electrode 406. Said gate line 410 and said gate electrode 406 are formed in the same process, which facilitates simplifying the techniques and reducing the cost.

Array substrate 400 may further comprise a passivation layer 407 that covers said gate electrode 406, said gate insulating layer 405 and said gate line 410. Said passivation layer 407 protects the gate electrode 406 from being oxidized or corroded. Owing to the top-gate-type design, said pixel electrode 403 and said source/drain electrode 402 are formed on said substrate plate 401 simultaneously, so said pixel electrode 403 is covered by both said gate insulating layer 403 and said passivation layer 407, which effectively prevents the pixel electrode 403 from being oxidized or corroded.

As shown in FIG. 3, a first via hole 411 penetrating the gate insulating layer 405 and the passivation layer 407 can be provided above the data line 409, and a second via hole 412 penetrating the passivation layer 407 can be provided above the gate line 410. As compared with an existing structure having three via holes, only two via holes are required in the array substrate of this disclosure, which is helpful for offsetting the loss of the aperture ratio. Moreover, the first via hole 411 and the second via hole 412 can be covered by a metal protecting layer 408.

As shown in FIG. 3, in a direction perpendicular to said substrate plate 401, the projection of said active region 404 completely falls within the projection of said gate electrode 406. Thereby, said gate electrode 406 is arranged above said active region 404 and its projection in a perpendicular direction completely covers said active region 404, such that ambient light can be completely blocked by said gate electrode 406, thereby preventing irradiation of active region 404.

Now the fabricating method of the array substrate of this disclosure shall be described in detail with reference to FIGS. 4A, 4B, 4C, 4D and FIG. 3.

Figure 4A:
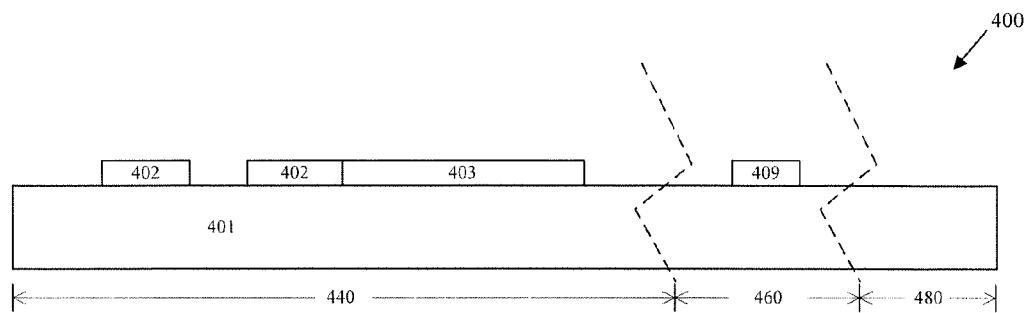
FIGS. 4A, 4B, 4C and 4D are schematic cross-sectional views of the array substrate according to this disclosure in different fabricating stages.

As shown in FIG. 4A, on a substrate plate 401 formed of, for example, glass, a metal layer is deposited by means of sputtering, evaporation and so on. A pattern comprising the source/drain electrode 402 and the pixel electrode 403 is formed by a first patterning process. With the first patterning process, a data line 409 can also be formed in a data line region 460. Prior to depositing the above metal layer, a dielectric material can be deposited on the substrate plate 401 by means of physical vapor deposition, chemical vapor deposition and so on, so as to form an active region protecting layer. The dielectric material can be an inorganic insulating layer of, for instance, oxide, nitride or oxynitride. The first patterning process may comprise techniques such as coating a photoresist, exposing it with masks, developing the photoresist, etching the object to be patterned and peeling the photoresist.

Figure 4B:
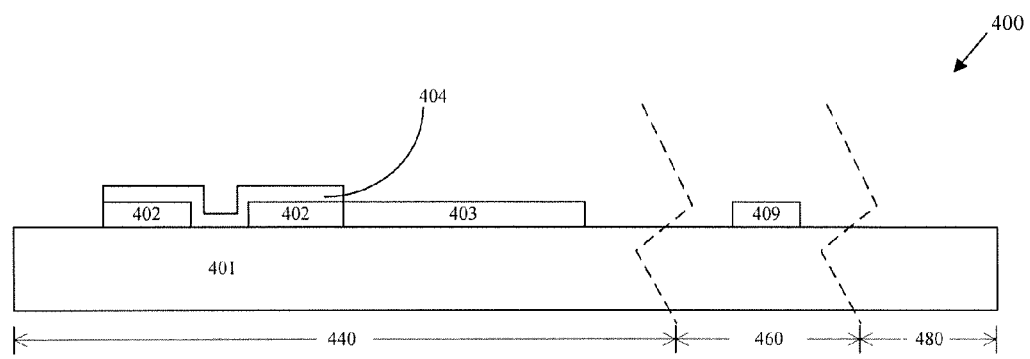

As shown in FIG. 4B, a semiconductor layer is deposited on the structure shown in FIG. 4A by means of sputtering, evaporation and so on. A pattern comprising the active region 404 is formed by a second patterning process. The materials of the semiconductor layer can be metal oxide semiconductors such as, for example, IGZO, IGO, IAO, IZO, or the like.

Figure 4C:
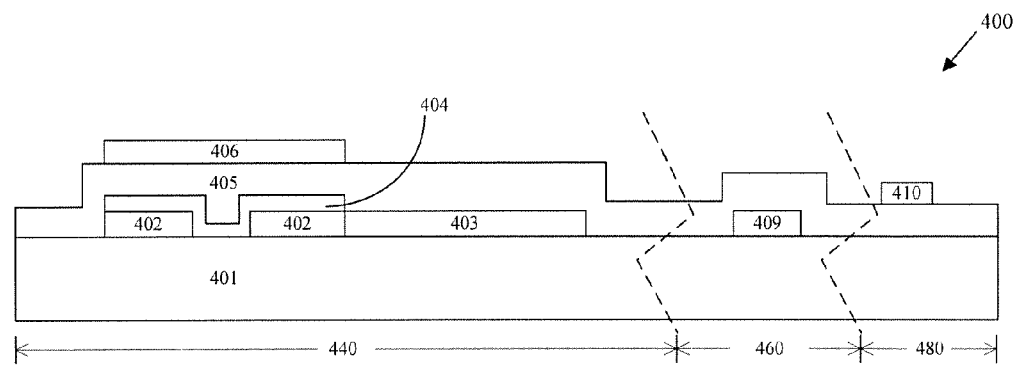

As shown in FIG. 4C, a gate insulating layer 405 of oxide, nitride or oxynitride is deposited on the structure shown in FIG. 4B by means of physical vapor deposition, chemical vapor deposition and so on. The gate insulating layer 405 can be single layered or multi-layered depending upon needs. Subsequently, a gate electrode metal layer is deposited by means of sputtering, evaporation and so on. A pattern comprising the gate electrode 406 is formed by a third patterning process. The gate electrode 406 can be selected from the group of metals consisting of Mo, Al, Cu, Mg, Ca, Cr, W, Ti, Ta, etc., or alloys thereof, and can be made of multiple layers of metals. With the third patterning process, a gate line 410 can also be formed in the gate line region 480 simultaneously.

Figure 4D:
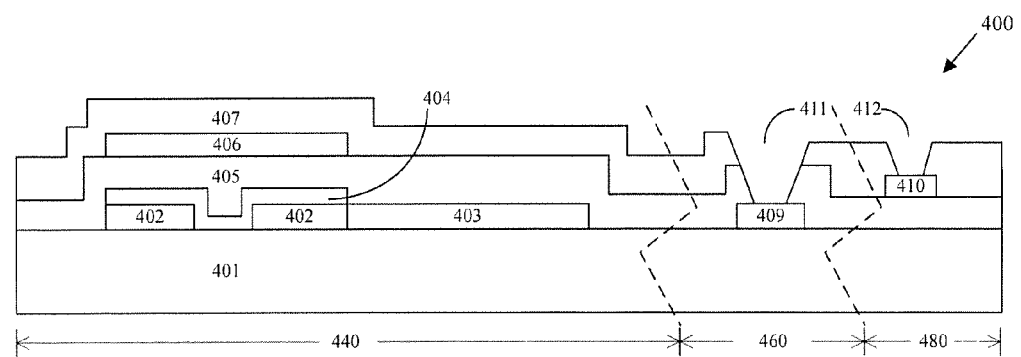

As shown in FIG. 4D, a passivation layer 407 is deposited on the structure shown in FIG. 4C by means of physical vapor deposition, chemical vapor deposition and so on. A first via hole 411 above the data line 409 and a second via hole 412 above the gate line 410 are formed by a fourth patterning process. As shown in FIG. 3, a gate electrode metal layer is deposited on the structure shown in FIG. 4D by means of sputtering, evaporation and so on. A metal protecting layer 408 (FIG. 3) is formed by a fifth patterning process.

In the fabricating method according to this disclosure, since the source/drain electrode and the pixel electrode are formed simultaneously, the patterning process is required only five times to fabricate an array substrate.

Figure 5:
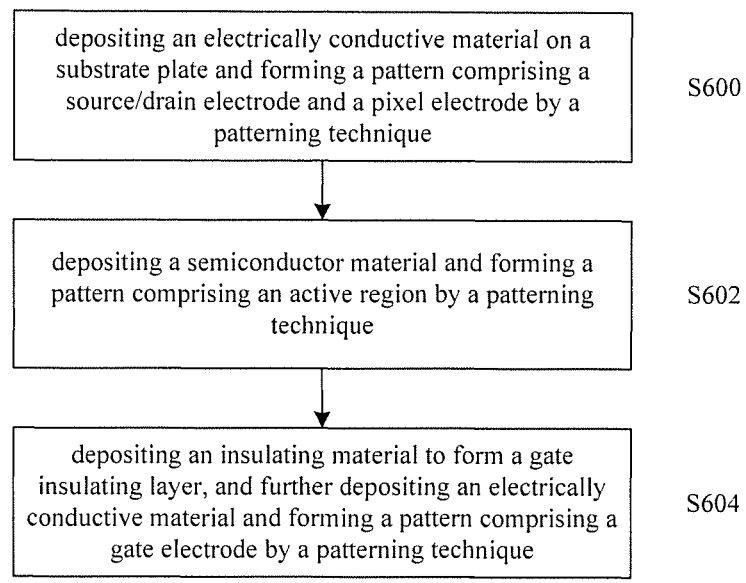
FIG. 5 is a flow chart of the fabricating method of the array substrate according to this disclosure.

FIG. 5 is a flow chart of the fabricating method of the array substrate according to this disclosure. A method for fabricating an array substrate, comprises: step S600, depositing an electrically conductive material on a substrate plate and forming a pattern comprising a source/drain electrode and a pixel electrode by a patterning process; step S602, depositing a semiconductor material on the substrate plate obtained from step S600 and forming a pattern comprising an active region by a patterning process; and step S604, depositing an insulating material on the substrate plate obtained from step S602 to form a gate insulating layer, and further depositing an electrically conductive material and forming a pattern comprising a gate electrode by a patterning process.

The method may further comprise: prior to step S600, depositing a dielectric material on the substrate plate to form an active region protecting layer.

In step S600, said patterning process may further form a data line located in a data line region.

In step S604, said patterning process may further form a gate line located in a gate line region.

The method may further comprise: depositing a dielectric material on said substrate plate obtained from step S604 and forming a pattern comprising a passivation layer by a patterning process.

The method may further comprise: forming a first via hole penetrating said gate insulating layer and said passivation layer above said data line, forming a second via hole penetrating said passivation layer above said gate line, depositing an electrically conductive material and forming a pattern comprising a metal protecting layer by a patterning process.

A liquid crystal display panel can be readily obtained by assembling the array substrate described above with a color filter substrate having a transparent common electrode. A reflective liquid crystal display can be readily obtained by assembling the liquid crystal display panel with parts such as a driving circuit.

The above descriptions of the embodiments of this disclosure are provided only for illustrative and explanatory purposes. They do not aim to be exhaustive for or restrictive to the content of this disclosure. Therefore, those skilled in the art can easily conceive of many adjustments and modifications. The scope of this disclosure shall be defined by the appended claims.

The invention claimed is:

1. An array substrate comprising:
   a substrate plate; and
   a thin film transistor and a pixel electrode formed on the substrate plate, said thin film transistor comprising:
      a source electrode, a drain electrode, an active region, and a gate electrode stacked sequentially on said substrate plate;
   wherein said source electrode, drain electrode, and pixel electrode are arranged in a same layer on the substrate plate;
   wherein the array substrate further comprises:
      a data line located in a data line region and disposed in the same layer as said source and drain electrodes;
      a gate line located in a gate line region and disposed in the same layer as said gate electrode; and
      a passivation layer covering the gate, electrode, the gate insulating layer and the gate line; and
   wherein a first via hole penetrating said gate insulating layer and said passivation layer is provided above said data line, a second via hole penetrating said passivation layer is provided above said gate line, and said first and second via holes are covered by a metal protecting layer.

2. The array substrate according to claim wherein the array substrate further comprises an active region protecting layer disposed between the substrate plate and the thin film transistor.

3. The array substrate according to claim 1, wherein the array substrate further comprises a gate insulating layer which is disposed between the active region and the gate electrode and wherein the gate insulating layer covers the active region source electrode, drain electrode, pixel electrode, and data line.

4. The array substrate according to claim 1, wherein an orthogonal projection of the active region onto the substrate plate is completely within an orthogonal projection of the gate electrode onto the substrate plate.

5. A liquid crystal display panel comprising:
   the array substrate according to claim 1;
   a color filter substrate; and
   liquid crystals disposed between the array substrate and the color filter substrate.

* * * * *